United States Patent
Hoffman et al.

(10) Patent No.: US 8,310,223 B2
(45) Date of Patent: Nov. 13, 2012

(54) ELECTRICAL PROBE AND ASSOCIATED METHOD

(75) Inventors: Edward K. Hoffman, Anaheim, CA (US); Thomas A. Miller, Redondo Beach, CA (US)

(73) Assignee: The Boeing Company, Chicago, IL (US)

( * ) Notice: Subject to any disclaimer, the term of this patent is extended or adjusted under 35 U.S.C. 154(b) by 268 days.

(21) Appl. No.: 12/859,713

(22) Filed: Aug. 19, 2010

(65) Prior Publication Data

US 2012/0043985 A1 Feb. 23, 2012

(51) Int. Cl.
*G01R 31/02* (2006.01)
*G01R 31/20* (2006.01)

(52) U.S. Cl. .................... 324/72.5; 324/754.02

(58) Field of Classification Search ............. 324/754.02, 324/754.2, 755.02, 755.05, 755.11, 72.5
See application file for complete search history.

(56) References Cited

U.S. PATENT DOCUMENTS

| 2,529,270 | A | 11/1950 | Webster |
| 4,716,365 | A | 12/1987 | Pool |
| 7,355,377 | B1 * | 4/2008 | Gallentine ................ 324/72.5 |

OTHER PUBLICATIONS

International Search Report from International Patent Application No. PCT/US2011/044717, filed Jul. 20, 2011.

* cited by examiner

*Primary Examiner* — Roberto Velez
(74) *Attorney, Agent, or Firm* — Alston & Bird LLP

(57) ABSTRACT

An electrical probe and associated method are provided to establish electrical contact with a wire. The electrical probe includes an elongate member extending between opposed first and second ends, and first and second needles connected to the elongate member and extending beyond the first end of the elongate member. The electrical probe also includes first and second conductors electrically connected to the first and second needles, respectively, and extending along the elongate member. The electrical probe also includes a bumper stop connected to the elongate member proximate the first end of the tube. Further, the electrical probe includes a movable engagement member extending lengthwise along the elongate member. The moveable engagement member includes a hook that extends beyond the first end of the elongate member and beyond the first and second needles. The hook may include a terminal portion configured to contact the bumper stop.

20 Claims, 6 Drawing Sheets

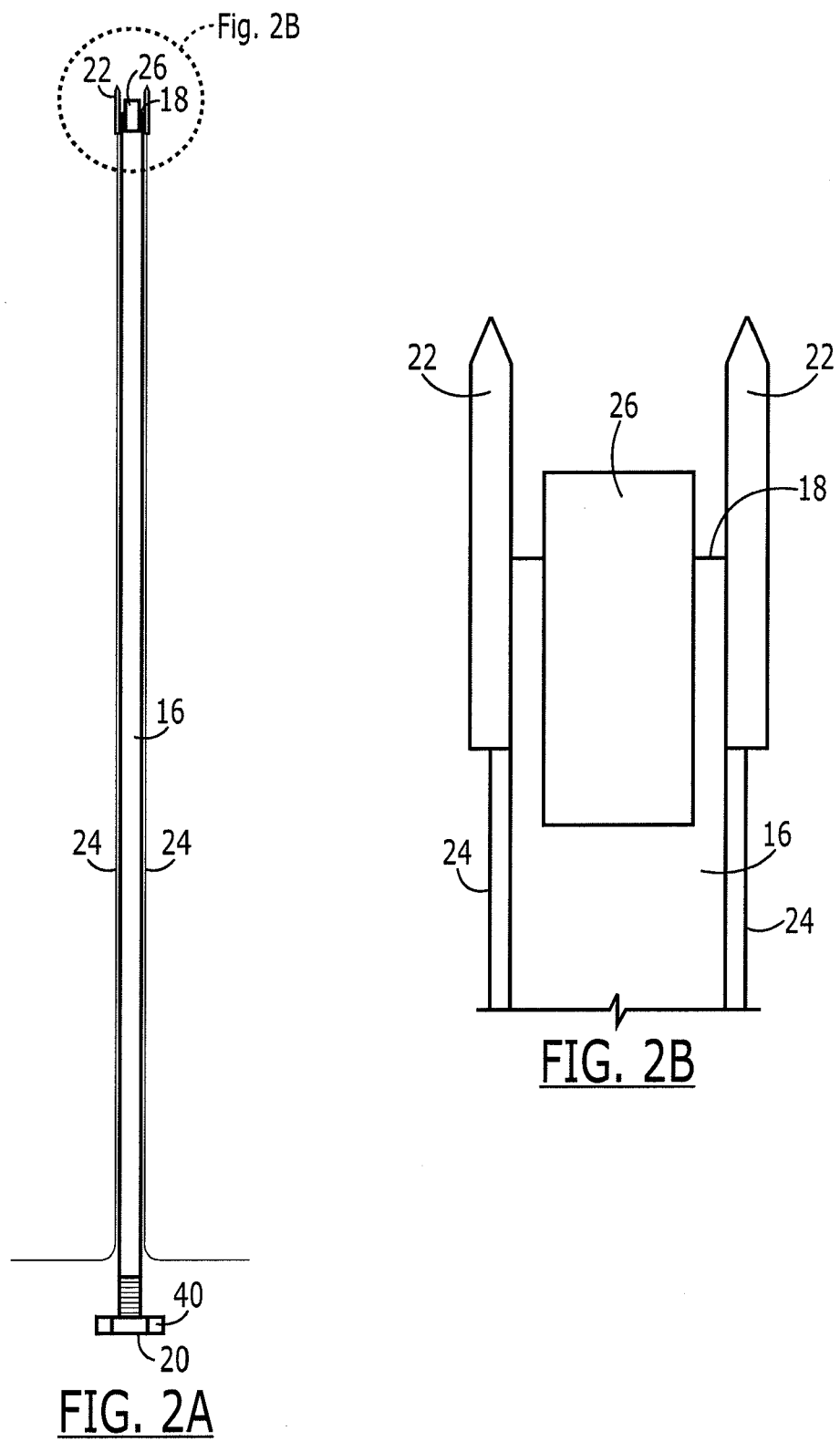

US 8,310,223 B2

ELECTRICAL PROBE AND ASSOCIATED METHOD

FEDERALLY SPONSORED RESEARCH OR DEVELOPMENT

This application was made with Government support under contract number BT2E006 awarded by the United States Air Force. The Government has certain rights to this application.

TECHNOLOGICAL FIELD

Embodiments of the present disclosure relate generally to an electrical probe and, more particularly, to an electrical probe and an associated method for penetrating a wire with first and second needles in order to reliably establish electrical contact therewith.

BACKGROUND

In a number of instances, it is desirable to establish electrical contact with a wire. For example, in applications that include a relatively large number of wires, it may be desired to establish electrical contact with a wire in order to identify the wire and to distinguish the wire from all other wires. Additionally, electrical contact may be established with wires in order to test the wires, such as by performing various electrical diagnostic and functional tests, such as measurements of the resistance of the wire, the voltage on the wire, etc., to replace a damaged wire or the like.

In order to make electrical contact with a wire, wires have conventionally been cut and the insulation covering the wire has then been stripped in order to access and make electrical contact with the wire. As will be apparent, this technique is quite invasive and requires physical access to receive. In some instances, wiring may be positioned in an area that is difficult to access. For example, wiring may extend through a cavity that is relatively small and deep, thereby significantly limiting the accessibility of a wire. In order to access and then make contact with a wire that is disposed in a region of limited accessibility, disassembly, sometimes on a large scale, may be required in order to provide increased accessibility to the wire so as to allow electrical contact to be established with the wire. Such disassembly may disadvantageously introduce delays and increase costs and, in some instances, may necessitate retesting to ensure that the assembly remains operational following the disassembly and subsequent re-assembly.

Establishing contact with a wire, such a wire disposed within a region of limited accessibility may be particularly challenging in instances in which the wire has a smaller gauge, such as 24 American wire gauge (awg) or thinner wires. In this regard, the reliable establishment of electrical contact with smaller wires may prove to be more difficult, particularly in regions of limited accessibility.

BRIEF SUMMARY

An electrical probe and associated method are provided according to an embodiment of the present disclosure in order to facilitate the establishment of electrical contact with a wire, such as for identifying the wire, testing the wire or the like. Although the electrical probe may establish contact with wires of any size, the electrical probe and associated method of one embodiment are configured to facilitate the establishment of electrical contact with smaller gauge wires, such as 24 awg wire. Additionally, while the electrical probe may establish contact with a wire in any of a number of different environments, the electrical probe and associated method of one embodiment are advantageously capable of establishing verifiable electrical contact with a wire that is disposed within a region of a limited accessibility.

In one embodiment, an electrical probe is provided that includes a tube formed, for example, of a non-conductive material extending between opposed first and second ends, first and second needles operably connected to the tube and extending beyond the first end of the tube and a bumper stop operably connected to the tube proximate the first end of the tube. The electrical probe of this embodiment also includes a moveable engagement member extending through the tube. The moveable engagement member includes a hook that extends beyond the first end of the tube and beyond the first and second needles. The hook includes a terminal portion configured to operably contact the bumper stop, thereby limiting retraction of one moveable engagement member relative to the tube.

The electrical probe of one embodiment may also include first and second conductors electrically connected to the first and second needles, respectively, and extending along the tube. In one embodiment, the bumper stop extends beyond the first end of the tube. In this embodiment, the first and second needles and the bumper stop are operably connected to the tube such that the first and second needles extend beyond the bumper stop. The electrical probe of one embodiment may also include a spring positioned proximate the second end of the tube and configured to draw the hook into operable engagement with the bumper stop. In this regard, the movable engagement member may include a plunger with the spring being positioned between the plunger and the second end of the tube. The electrical probe of this embodiment may also include an adjustment member that is adjustably positioned between the tube proximate the second end such that the spring extends between the plunger and the adjustment member.

In another embodiment, an electrical probe is provided that includes an elongate member extending between opposed first and second ends, and first and second needles operably connected to the elongate member and extending beyond the first end of the elongate member. The electrical probe of this embodiment also includes first and second conductors electrically connected to the first and second needles, respectively, and extending along the elongate member. The electrical probe also includes a bumper stop operably connected to the elongate member proximate the first end of the tube. Further, the electrical probe of this embodiment includes a movable engagement member extending lengthwise along the elongate member. The moveable engagement member includes a hook that extends beyond the first end of the elongate member and beyond the first and second needles. In one embodiment the hook may include a terminal portion configured to operably contact the bumper stop.

In one embodiment, the bumper stop extends beyond the first end of the elongate member. In this embodiment, the first and second needles and the bumper stop are operably connected to the elongate member such that the first and second needles extend beyond the bumper stop. The electrical probe of one embodiment may also include a spring positioned proximate the second end of the elongate member and configured to draw the hook into operable engagement with the bumper stop. In this regard, the movable engagement member may include a plunger with the spring being positioned between the plunger and the second end of the elongate member. The electrical probe of this embodiment may also include an adjustment member that is adjustably positioned between the elongate member proximate the second end such that the spring extends between the plunger and the adjustment member.

A method is provided according to yet another embodiment that includes actuating a movable elongate member of an electrical probe relative to an elongate member such that a hook proximate one end of the moveable engagement member extends and provides access to first and second needles that are operably connected to and extend beyond a first end of the elongate member. The method of this embodiment also positions the electrical probe such that a wire is positioned proximate to the first and second needles. The moveable engagement member is then retracted relative to the elongate member such that the hook contacts the wire and urges the first and second needles to penetrate the wire. The method of this embodiment also prevents further retraction of the moveable engagement member relative to the elongate member as a result of contact by a terminal portion of the hook with a bumper that is operably connected to the elongate member proximate to the first end of the elongate member.

In one embodiment, the method also establishes electrical contact with the first and second needles via first and second conductors, respectively, that extend along the elongate member. The method of this embodiment may also include electrically testing the wire via the first and second conductors and the first and second needles. In one embodiment in which the elongate member comprises a tube through which the moveable engagement member extends, actuation of the moveable engagement member includes sliding the moveable engagement member in a first direction through the tube, while retracting the moveable engagement member comprises sliding the moveable engagement member in a second direction, opposite the first direction, through the tube. In one embodiment in which a spring is positioned proximate a second end of the elongate member, opposite the first end, retraction of the moveable engagement member includes biasing the moveable engagement member with the spring so as to retract relative to the elongate member. In this embodiment, the moveable engagement member may include a plunger with the spring being positioned between the plunger and the second end of the elongate member such that actuation of the moveable engagement member may include depression of the plunger relative to the elongate member.

In accordance with embodiments of the electrical probe and associated method, verifiable establishment of contact with a wire is facilitated, even in instances in which the wire is small and disposed in a region having limited accessibility. However, the features, functions and advantages that have been discussed may be achieved independently in various embodiments of the present disclosure may be combined in yet other embodiments, further details of which may be seen with reference to the following description and drawings.

BRIEF DESCRIPTION OF THE DRAWINGS

Figure 1:
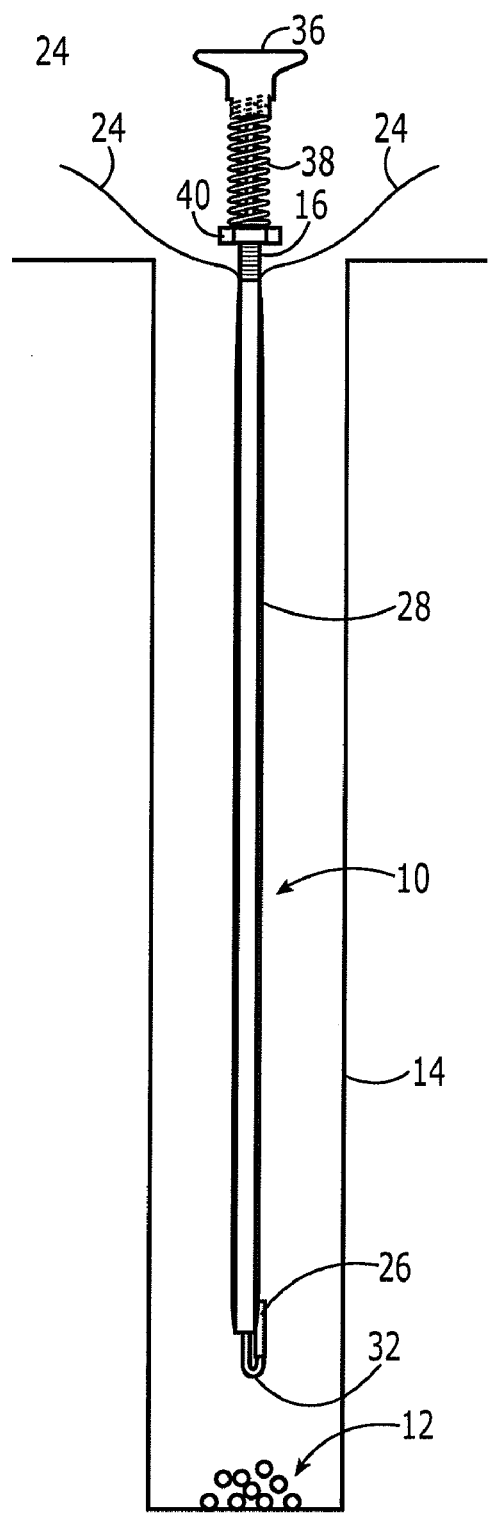
Figure 3A:
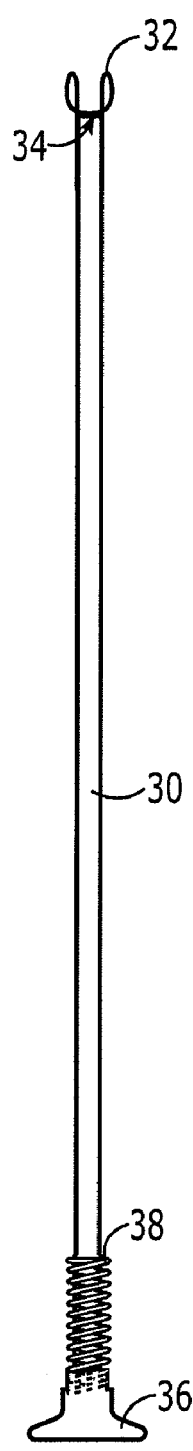
Figure 3B:
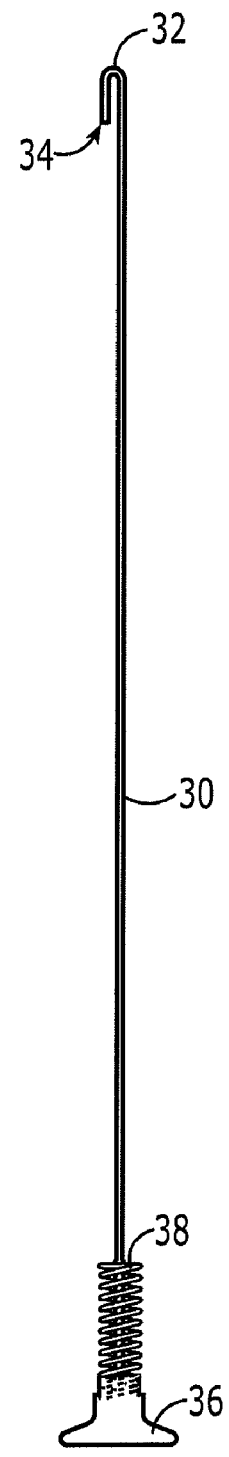
Figure 4A:
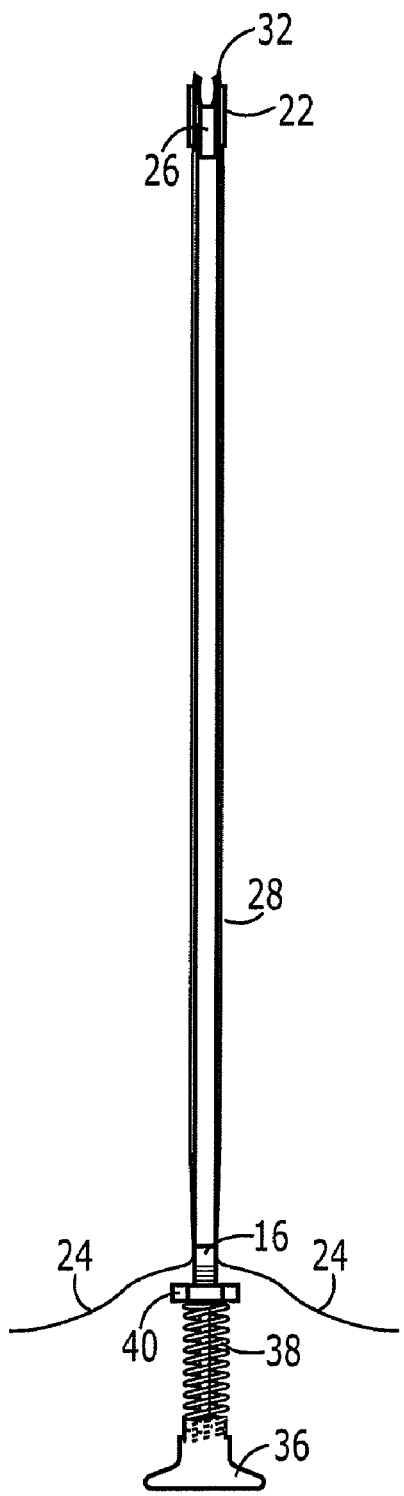
Figure 4B:
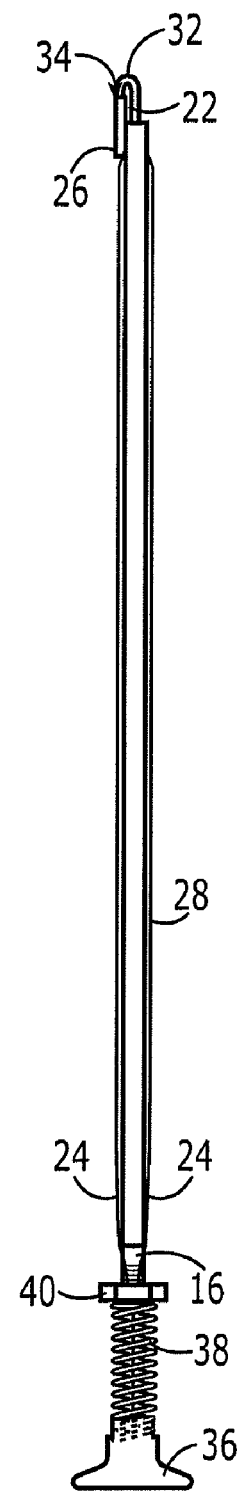
Figure 5A:
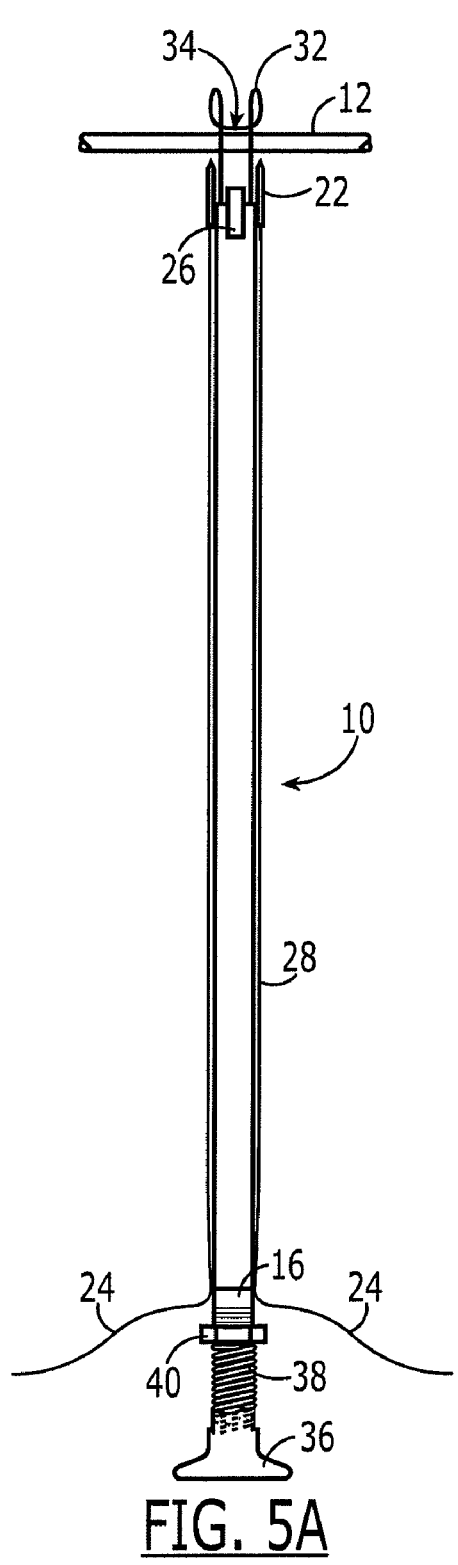
Figure 5B:
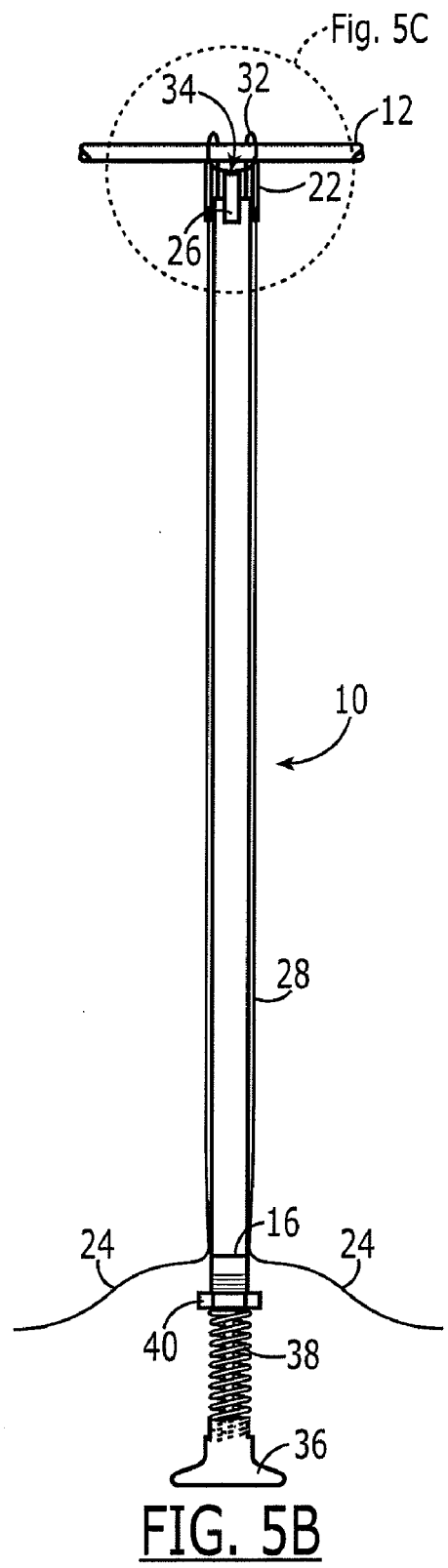
Figure 5C:
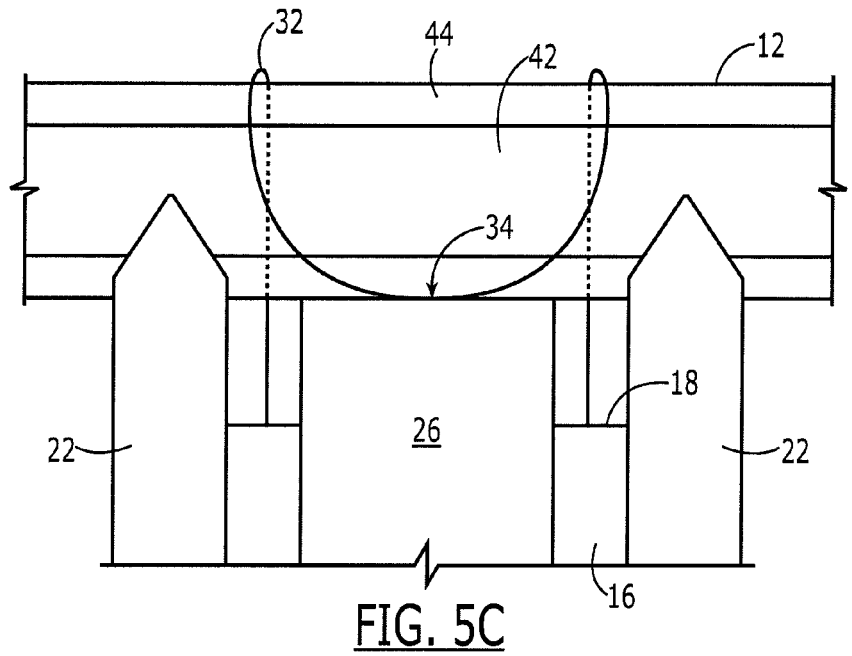
Figure 6:
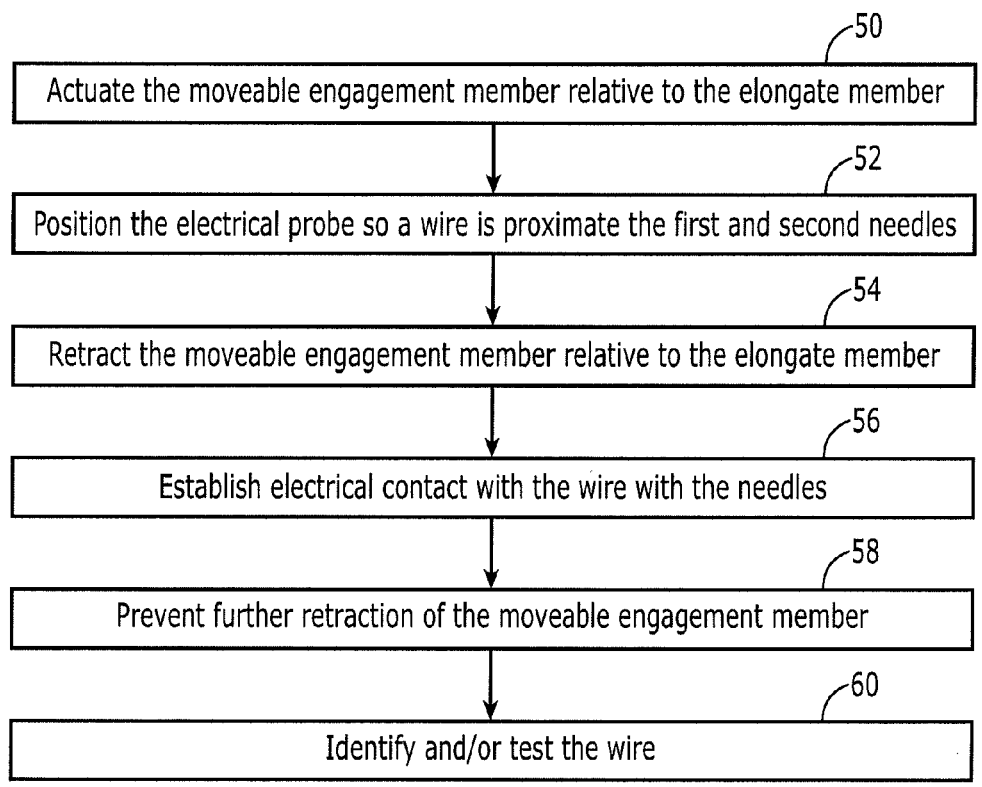

Having thus described embodiments of the present disclosure in general terms, reference will now be made to the accompanying drawings, which are not necessarily drawn to scale, and wherein:

FIG. 1 is a perspective view of an electrical probe in accordance with one embodiment of the present disclosure in the process of establishing electrical contact with a wire within a region having limited accessibility;

FIG. 2A is a plan view of a portion of an electrical probe in accordance with one embodiment of the present disclosure;

FIG. 2B is a fragmentary plan view of one end of a tube and the first and second needles and the bumper stop that are operably connected to the tube in accordance with one embodiment of the present disclosure;

FIG. 3A is a plan view of a moveable engagement member of an electrical probe in accordance with one embodiment of the present disclosure;

FIG. 3B is a side view of the moveable engagement member of FIG. 3A;

FIG. 4A is a plan view of an electrical probe in accordance with one embodiment of the present disclosure;

FIG. 4B is a side view of the electrical probe of FIG. 4A;

FIG. 5A is a plan view of an electrical probe in accordance with one embodiment of the present disclosure in which the moveable engagement member has been actuated so as to permit the electrical probe to engage a wire;

FIG. 5B is a plan view of the electrical probe of FIG. 5A in which the moveable engagement member is retracted in order to establish electrical contact with the wire;

FIG. 5C is a fragmentary cross-sectional view illustrating the engagement of the wire by the first and second needles in accordance with one embodiment of the present disclosure; and FIG. 6 is a flow chart illustrating operations performed in accordance with a method of one embodiment of the present disclosure.

DETAILED DESCRIPTION

The present disclosure now will be described more fully hereinafter with reference to the accompanying drawings, in which some, but not all embodiments are shown. Indeed, these embodiments may be embodied in many different forms and should not be construed as limited to the embodiments set forth herein; rather, these embodiments are provided so that this disclosure will satisfy applicable legal requirements. Like numbers refer to like elements throughout.

As shown in FIG. 1, an electrical probe 10 in accordance with one embodiment is configured to establish electrical contact with a wire 12. In one embodiment the electrical probe 10 is configured to establish electrical contact with wires of a relatively small gauge, such as 24 AWG. However, the electrical probe 10 may establish electrical contact with wires of any size and any gauge. The wire 12 is generally insulated so as to include a conductor surrounded by an insulating coating. The electrical probe 10 may be configured to contact other types of wires, such as uncoated wires, if so desired.

The electrical probe 10 is configured to establish electrical contact with wires 12 in a variety of environments or situations. As shown in FIG. 1, however, the electrical probe 10 may advantageously establish electrical contact with wires 12 that are disposed within regions of limited accessibility, such as wires disposed within cavities 14 that are relatively small and deep or that otherwise have limited accessibility. By permitting electrical contact to be established with wires 12 within these regions of limited accessibility, the electrical probe 10 and associated method of one embodiment may permit wires to be identified without requiring any significant disassembly, therefore avoiding the time delays and costs associated with such disassembly.

As shown in FIG. 2A, the electrical probe 10 of one embodiment includes an elongate member 16 extending between opposed first and second ends 18, 20. In the illustrated elongate member, the elongate member 16 is a tube that defines an internal passage that extends between the opposed first and second ends 18, 20. The elongate member 16 may have a length that is selected based upon the reach that is desired for the electrical probe 10. In this regard, an electrical probe 10 that is designed to establish electrical contact with wires 12 disposed within a cavity 14 having a depth of 12 inches may have a length of about 14 inches in order to allow the electrical probe to comfortably access the wire. However, the elongate member 10 may be longer or shorter in other embodiments depending upon the environment intended to be serviced. The elongate member 16, such as the tube, may generally formed of a non-conductive material, such as a Delron® material. Alternatively, the elongate member 16 may be formed of a conductive material, such as brass. In an instance in which the elongate member 16 is formed of a conductive material, the elongate member may also include an insulative coating, such as an insulative shrink sleeve that covers the conductive material, or the conductors 24 that extend along the elongate member and are described below may include an insulative coating so as to be electrically isolated from the elongate member.

As shown in FIG. 2A, and, in more detail in FIG. 2B, the electrical probe 10 includes a plurality of needles 22, such as first and second needles positioned proximate the first end 18 of the elongate member 16. The needles 22 are formed of a conductive material, such as steel, and have a pointed end. In one embodiment, the first and second needles 22 are sewing needles. The needles 22 may be attached to the elongate member in various manners including, for example, by an epoxy adhesive. Regardless of the manner in which the needles 22 are attached to the elongate member 16, the pointed ends of the needles extend beyond the first end 18 of the elongate member. Although the needles 22 may extend beyond the first end 18 of the elongate member 16 by the same distance, the needles are advantageously spaced from one another by predetermined spacing, such as between about 5 and 8 mils.

The electrical probe 10 may also include conductors 24 that are attached at one end to respective ones of the needles 22 and that extend lengthwise along the elongate member 16. The conductors 24 are generally relatively small, such as 24 awg sense wires, and may include an insulative coating, at least on that portion of the conductors that extend along the elongate member.

The electrical probe 10 also includes a mechanical bumper stop 26 positioned proximate the first end 18 of the elongate member 16 and also proximate the needles 22. In the illustrated embodiment, the bumper stop 26 is attached to the first end 18 of the elongate member 16 so as to extend beyond the elongate member. However, the needles 22 advantageously extend further beyond the first end 18 of the elongate member 16 than the bumper stop 26. As shown in the illustrated embodiment, the bumper stop 26 may be operably attached to the first end 18 of the elongate member 16 so as to be positioned between the needles 22. The bumper stop 26 may also be attached to the first end 18 of the elongate member 16 in a variety of manners including, for example, by an adhesive. Additionally, a non-conductive sleeve 28, such as a sleeve formed of a heat shrinkable material, such as Kynar® shrink sleeving, may surround the elongate member 16 and the conductors 24 as well as those portions of the needles 22 and bumper stop 26 that are operably attached to the elongate member. The shrink sleeve may therefore serve to maintain the conductors 24 in position relative to the elongate member 16, and may also serve to further secure at least the bumper stop 26 to the elongate member.

The electrical probe 10 can also include a movable engagement member 30 as shown in FIGS. 3A and 3B. The movable engagement member 30 may be formed in various manners, but, in one embodiment, is formed of rod wire, such as steel. The movable engagement member 30 extends lengthwise along the elongate member 16 and protrudes beyond the first end 18 of the elongate member. In the embodiment in which the elongate member 16 is comprised of a tube, the movable engagement member 30 is advantageously sized such that the movable engagement member extends through the tube from one end of the tube to the other. The movable engagement member 30 includes a hook 32 proximate one end. As shown in FIGS. 4A and 4B, the movable engagement member 30 is positioned relative to the elongate member 16 such that the hook 32 extends beyond the first end 18 of the elongate member and beyond the needles 22. In this regard, the hook 32 is shaped so as to extend over and about the pointed ends of the needles 22. The hook 32 has a terminal portion 34 that is configured to operably contact the bumper stop 26 so as to limit the retraction of the hook relative to the elongate member 16. As shown, the hook 32 is spaced from the pointed ends of the needles 22 by a predefined distance in an instance in which the terminal portion 34 of the hook operably contacts the bumper stop 26. The predefined distance by which the hook 32 is spaced from the pointed ends of the needles 22 is advantageously no larger than the diameter of the largest wires 12 to be inspected by the electrical probe 10 and, more particularly, is generally somewhat smaller than the largest wires to be inspected by the electrical probe.

Opposite the hook 32, the movable engagement member 30 may include a plunger 36 or other head. The electrical probe 10 may also include a spring 38 positioned between the second end 20 of the elongate member 16 and the plunger 36 or other head of the movable engagement member 30. The spring 38 biases the plunger 36 or other head of the movable engagement member 30 such the movable engagement member is positioned relative to the elongate member 16 such that the terminal portion 34 of the hook 32 is moved into operable contact with the bumper stop 26 in the absence of other forces, such as a wire 12 disposed between the hook and the needles 22. In the illustrated embodiment, the electrical probe 10 also includes an adjustment member 40 that is adjustably positioned upon the elongate member 16 proximate the second end 20 of the elongate member. In the embodiment in which the elongate member 16 is a tube, the portion of the tube proximate the second end 20 may be threaded such that the adjustment member, such as a nut, may be threadably positioned relative to the second end of the tube. In this embodiment, the spring 38 extends between the plunger 36 or other head of the moveable engagement member 30 and the adjustment member 40 in order to bias the movable engagement member relative to the elongate member 16. By controllably positioning the adjustment member 40 in a lengthwise direction relative to the elongate member 16, the tension or force applied by the spring may be controlled in order to draw the movable engagement member 30 rearward relative to the elongate member such that the terminal portion 34 of the hook 32 operably contacts the bumper stop 26.

In operation, the electrical probe 10 may be positioned relative to a wire 12 to be identified inspected, tested or the like such that the wire is proximate the first end 16 of the elongate member 16. As shown in operation 50 of FIG. 6, the plunger 36 may be actuated, such as by being depressed or otherwise urged towards the second end 20 of the elongate member 16, such that the hook 32 extends further from the first end 18 of the elongate member and a space is opened between the pointed ends of the needles 22 and the hook. The elongate probe 10 may be further positioned relative to the wire 12 such that the wire is positioned so as to extend within the hook 32 and across the needles 22, as shown in FIG. 5A and in operation 52 of FIG. 6. The plunger 36 may then be released such that the spring 38 retracts the movable engagement member 30 relative to the elongate member 16. See operation 54 of FIG. 6. In this regard, the hook 32 pulls the wire 12 towards the first end 18 of the elongate member 16 such that the pointed ends of the needles 22 pierce the insulative coating of the wire and penetrates the conductive member of the wire, thereby establishing electrical contact between the conductive member of the wire and the needles, as shown in operation 56 of FIG. 6. See also FIG. 5B and, in more detail, FIG. 5C. The retraction of the movable engagement member 30 relative to the elongate member 16 is limited, however, by the operable contact or the terminal portion 34 of the hook 30 with bumper stop 26. See operation 58 of FIG. 6. By limiting the retraction of the movable engagement member 30 relative to the elongate member 16, the electrical probe 10 of one embodiment may insure that the needles 22 penetrate the conductive member 42 of the wire 12, but do not extend through the conductive member into the insulative member 44 on the far side of the wire or even further, as shown in FIG. 5C.

As such, electrical contact is established in a reliable fashion with the wire 12. In this regard, electrical contact may be established with the wire 12 via the needles 22 and the conductors 24 that extend lengthwise along the elongate member 16. Since the electrical probe 10 includes two or more needles 22 that are spaced apart from one another and that each make electrical contact with the wire 12, it may be initially verified that the needles have made electrical contact with the wire, since the wire may be located within a cavity or other region of limited accessibility such that it may not be practical to visually confirm that the needles have each made contact with the wire. In this regard, a current may be passed through the conductors 24 from one needle 22 to the other needle such that the electrical conductivity and/or resistivity may be measured. Based on the conductivity and/or resistivity measurement, the needles 22 may be verified to have established electrical contact with the same wire 12. The wire 12 may then be identified or tested in a variety of fashions including continuity measurements, resistance measurements and/or voltage measurements utilizing current passed through either one or both needles 24. See operation 60 of FIG. 6. For example, resistance may be determined via Ohms law by applying a small current via the conductors 24 and, in turn, the pair of needles 22. By increasing the amperes of the current that is provided via the conductors 24, the accuracy of the resistance measurement increases and the resistance reading could be utilized to determine the wire length if multiple wires in the same harness routing path have different juncture points. The electrical probe 10 may be employed for other electrical diagnostic test procedures including circuit/signal monitoring, two-point resistance measurement, four-wire milli-ohm resistance measurements, voltage sense and the like. Once the wire 12 has been appropriately identified or otherwise tested, the process may be reversed. In this regard, the plunger 36 may be depressed such that the hook 32 is again spaced further from the first end 18 of the elongate member 16 and from the needles 22. The electrical probe 10 may then be disengaged from the wire 12 and the electrical probe withdrawn or otherwise moved so as to engage another wire.

As a result of the length of the electrical probe 10, the electrical probe may reliably identify and test wires 12 that are in regions that are relatively inaccessible, such as wires that are disposed within relatively small and deep cavities as shown in FIG. 1. In this regard, the electrical probe 10 may have any desired length depending upon the location of the wires 12 to be identified and tested. In one embodiment, however, the elongate probe 10 is about 14 inches in length.

Many modifications and other embodiments of the present disclosure set forth herein will come to mind to one skilled in the art to which the present disclosure pertains having the benefit of the teachings presented in the foregoing descriptions and the associated drawings. Therefore, it is to be understood that the present disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An electrical probe comprising:
a tube extending between opposed first and second ends;
first and second needles operably connected to the tube and extending beyond the first end of the tube;
a bumper stop operably connected to the tube proximate the first end of the tube; and
a moveable engagement member extending through the tube, wherein the moveable engagement member comprises a hook that extends beyond the first end of the tube and beyond the first and second needles, and wherein the hook comprises a terminal portion configured to operably contact the bumper stop.

2. An electrical probe according to claim 1 further comprising first and second conductors electrically connected to the first and second needles, respectively, wherein the first and second conductors extend along the tube.

3. An electrical probe according to claim 1 wherein the bumper stop extends beyond the first end of the tube, and wherein the first and second needles and the bumper stop are operably connected to the tube such that the first and second needles extend beyond the bumper stop.

4. An electrical probe according to claim 1 further comprising a spring positioned proximate the second end of the tube and configured to draw the hook into operable engagement with the bumper stop.

5. An electrical probe according to claim 4 wherein the moveable engagement member further comprises a plunger, and wherein the spring is positioned between the plunger and the second end of the tube.

6. An electrical probe according to claim 5 further comprising an adjustment member that is adjustably positioned upon the tube proximate the second end such that the spring extends between the plunger and the adjustment member.

7. An electrical probe according to claim 1 wherein the tube is comprised of a non-conductive material.

8. An electrical probe comprising:
an elongate member extending between opposed first and second ends;
first and second needles operably connected to the elongate member and extending beyond the first end of the elongate member;
first and second conductors electrically connected to the first and second needles, respectively, wherein the first and second conductors extend along the elongate member;
a bumper stop operably connected to the elongate member proximate the first end of the tube; and
a moveable engagement member extending lengthwise along the elongate member, wherein the moveable engagement member comprises a hook that extends beyond the first end of the elongate member and beyond the first and second needles.

9. An electrical probe according to claim 8 wherein the hook comprises a terminal portion configured to operably contact the bumper stop.

10. An electrical probe according to claim 8 wherein the bumper stop extends beyond the first end of the elongate member, and wherein the first and second needles and the bumper stop are operably connected to the elongate member such that the first and second needles extend beyond the bumper stop.

11. An electrical probe according to claim 8 further comprising a spring positioned proximate the second end of the elongate member and configured to draw the hook into operable engagement with the bumper stop.

12. An electrical probe according to claim 11 wherein the moveable engagement member further comprises a plunger, and wherein the spring is positioned between the plunger and the second end of the elongate member.

13. An electrical probe according to claim 12 further comprising an adjustment member that is adjustably positioned upon the elongate member proximate the second end such that the spring extends between the plunger and the adjustment member.

14. An electrical probe according to claim 8 wherein the elongate member is comprised of a non-conductive material.

15. A method comprising:
actuating a moveable engagement member of an electrical probe relative to an elongate member such that a hook proximate one end of the moveable engagement member extends and provides access to first and second needles that are operably connected to and extend beyond a first end of the elongate member;
positioning the electrical probe such that a wire is positioned proximate to the first and second needles;
retracting the moveable engagement member relative to the elongate member such that the hook contacts the wire and urges the first and second needles to penetrate the wire; and
preventing further retraction of the moveable engagement member relative to the elongate member as a result of contact by a terminal portion of the hook with a bumper that is operably connected to the elongate member proximate to the first end of the elongate member.

16. A method according to claim 15 further comprising establishing electrical contact with the first and second needles via first and second conductors, respectively, that extend along the elongate member.

17. A method according to claim 16 further comprising electrically testing the wire via the first and second conductors and the first and second needles.

18. A method according to claim 15 wherein the elongate member comprises a tube through which the moveable engagement member extends, wherein actuating the moveable engagement member comprises sliding the moveable engagement member in a first direction through the tube, and wherein retracting the moveable engagement member comprises sliding the moveable engagement member in a second direction, opposite the first direction, through the tube.

19. A method according to claim 15 wherein a spring is positioned proximate a second end of the elongate member, opposite the first end, and wherein retracting the moveable engagement member comprises biasing the moveable engagement member with the spring so as to retract relative to the elongate member.

20. A method according to claim 19 wherein the moveable engagement member comprises a plunger with the spring being positioned between the plunger and the second end of the elongate member, and wherein actuating the moveable engagement member comprises depressing the plunger relative to the elongate member.

* * * * *